(12) United States Patent
Christiansen et al.

(10) Patent No.: US 11,032,935 B1
(45) Date of Patent: Jun. 8, 2021

(54) SUPPORT STRUCTURE FOR A FLEXIBLE INTERCONNECT OF A SUPERCONDUCTOR

(71) Applicants: Martin Brokner Christiansen, Laurel, MD (US); Katharine Kramer Ferster, Baltimore, MD (US); Jonathan Francis Van Dyke, Baltimore, MD (US)

(72) Inventors: Martin Brokner Christiansen, Laurel, MD (US); Katharine Kramer Ferster, Baltimore, MD (US); Jonathan Francis Van Dyke, Baltimore, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 59 days.

(21) Appl. No.: 16/709,608

(22) Filed: Dec. 10, 2019

(51) Int. Cl.
*H05K 1/00* (2006.01)
*H05K 1/18* (2006.01)
(Continued)

(52) U.S. Cl.
CPC .............. *H05K 7/20* (2013.01); *H01L 24/72* (2013.01); *H01L 25/10* (2013.01); *H05K 7/06* (2013.01); *H01B 12/06* (2013.01); *H01R 4/68* (2013.01)

(58) Field of Classification Search
CPC . H05K 7/20; H05K 7/06; H01L 25/10; H01L 24/72; H01R 4/68; H01B 12/06
See application file for complete search history.

(56) References Cited

U.S. PATENT DOCUMENTS

| 110,422 A | 12/1870 | Beau |
| 3,475,795 A | 11/1969 | Youngblood |
(Continued)

FOREIGN PATENT DOCUMENTS

| EP | 2728983 A1 | 5/2014 |
| JP | S5830174 A | 2/1983 |
(Continued)

OTHER PUBLICATIONS

Japanese Office Action for Application No. 2019-528086 dated Jul. 21, 2020.
(Continued)

*Primary Examiner* — Yuriy Semenenko
(74) *Attorney, Agent, or Firm* — Tarolli, Sundheim, Covell & Tummino LLP

(57) ABSTRACT

A support structure for a flexible interconnect of a superconducting system can include a support member that is formed of thermally conductive material. The support member can include a plurality of parallel slots. Each slot can extend from a first surface of a base of the support member to a second surface of the base. The first and second surfaces of the base can be positioned on parallel planes and each slot can be shaped to allow relative movement of a fastener that allows a respective connector assembly to be affixed to the support member. Moreover, the respective connector assembly can provide mechanical support for the flexible interconnect of the superconducting system and establish a heat path between the flexible interconnect and the support member. The support member can also include a wall extending transverse from the first surface of the base, the wall comprising a plurality of through-holes.

20 Claims, 9 Drawing Sheets

(51) Int. Cl.
*H05K 7/00* (2006.01)
*H05K 7/20* (2006.01)
*H01L 25/10* (2006.01)
*H05K 7/06* (2006.01)
*H01L 23/00* (2006.01)
*H01R 4/68* (2006.01)
*H01B 12/06* (2006.01)

(56) References Cited

U.S. PATENT DOCUMENTS

| | | |
|---|---|---|
| 4,160,609 A | 7/1979 | Jackson et al. |
| 4,338,149 A | 7/1982 | Quaschner |
| 4,466,184 A | 8/1984 | Cuneo et al. |
| 4,687,695 A | 8/1987 | Hamby |
| 4,715,928 A | 12/1987 | Hamby |
| 4,737,118 A | 4/1988 | Lockard |
| 5,130,691 A | 7/1992 | Shintaku et al. |
| 5,160,269 A | 11/1992 | Fox, Jr. et al. |
| 5,161,981 A | 11/1992 | Deak et al. |
| 5,419,038 A | 5/1995 | Wang et al. |
| 5,854,534 A | 12/1998 | Beilin et al. |
| 6,040,624 A | 3/2000 | Chambers et al. |
| 6,603,079 B2 | 8/2003 | Biron |
| 6,793,544 B2 | 9/2004 | Brady |
| 6,924,551 B2 | 8/2005 | Rumer et al. |
| 7,012,812 B2 | 3/2006 | Haba |
| 7,251,712 B2 | 7/2007 | Unno |
| 7,407,408 B1 | 8/2008 | Taylor |
| 7,911,029 B2 | 3/2011 | Cui |
| 8,118,611 B2 | 2/2012 | Jeon |
| 8,262,873 B2 | 9/2012 | Wurm et al. |
| 8,359,738 B2 | 1/2013 | Takahashi et al. |
| 9,197,006 B2 | 11/2015 | Hack |
| 9,485,860 B2 | 11/2016 | Yosui |
| 9,524,470 B1 * | 12/2016 | Chow ................... G06N 10/00 |
| 9,743,529 B2 | 8/2017 | Lee et al. |
| 10,165,667 B1 * | 12/2018 | Christiansen ............. G06F 1/20 |
| 10,394,292 B1 * | 8/2019 | Van Dyke ............. H01L 23/445 |
| 10,785,891 B1 * | 9/2020 | Monroe ............... H05K 1/0203 |
| 2003/0114026 A1 | 6/2003 | Caldwell |
| 2004/0038072 A1 | 2/2004 | Miura |
| 2004/0043675 A1 | 3/2004 | Hiatt et al. |
| 2004/0049914 A1 | 3/2004 | Wang et al. |
| 2009/0014205 A1 | 1/2009 | Kobayashi et al. |
| 2010/0063555 A1 | 3/2010 | Janzig et al. |
| 2010/0112833 A1 | 5/2010 | Jeon |
| 2012/0042481 A1 | 2/2012 | Kempf |
| 2013/0089290 A1 | 4/2013 | Sloey et al. |
| 2013/0196855 A1 | 8/2013 | Poletto et al. |
| 2014/0175671 A1 | 6/2014 | Haba et al. |
| 2014/0353014 A1 | 12/2014 | Lai |
| 2014/0364004 A1 | 12/2014 | Oniki |
| 2015/0011107 A1 | 1/2015 | Hack |
| 2015/0055914 A1 | 2/2015 | Dell Anno et al. |
| 2016/0014893 A1 | 1/2016 | Yosui |
| 2016/0128238 A1 * | 5/2016 | Shedd ................... F25B 41/40 361/679.47 |
| 2017/0142820 A1 * | 5/2017 | Christiansen .......... H05K 13/00 |
| 2017/0303392 A1 * | 10/2017 | Naigertsik ......... H05K 7/20563 |
| 2018/0160304 A1 | 6/2018 | Liu et al. |
| 2019/0027800 A1 | 1/2019 | El Bouayadi et al. |
| 2019/0074568 A1 | 3/2019 | Henry et al. |
| 2020/0006655 A1 | 1/2020 | Tang et al. |
| 2020/0069855 A1 | 3/2020 | Matthes et al. |
| 2020/0083927 A1 | 3/2020 | Henry et al. |
| 2020/0244130 A1 * | 7/2020 | Palmer .................. H01B 12/02 |
| 2021/0005353 A1 * | 1/2021 | Van Dyke ............... G06F 1/183 |

FOREIGN PATENT DOCUMENTS

| | | |
|---|---|---|
| JP | 2002064271 A | 2/2002 |
| WO | 2006/132108 | 12/2006 |

OTHER PUBLICATIONS

Korean Office Action for Application No. 10-2019-7015946 dated Jan. 28, 2021.

International Search Report for Application No. PCT/US2020/054257 dated Jan. 21, 2021.

Non Final Office Action for U.S. Appl. No. 15/930,596 dated Feb. 2, 2021.

Non Final Office Action for U.S. Appl. No. 16/806,575 dated Mar. 18, 2021.

* cited by examiner

US 11,032,935 B1

SUPPORT STRUCTURE FOR A FLEXIBLE INTERCONNECT OF A SUPERCONDUCTOR

TECHNICAL FIELD

This disclosure relates to superconducting. More particularly, this disclosure relates to a support structure for flexible interconnect of a superconducting system.

BACKGROUND

Superconductivity is the set of physical properties observed in certain materials, wherein electrical resistance no longer exists and from which magnetic flux fields are expelled. Any material exhibiting these properties is a superconductor. Unlike an ordinary metallic conductor, whose resistance decreases gradually as its temperature is lowered even down to near absolute zero, a superconductor has a characteristic critical temperature below which the resistance drops abruptly to zero. An electric current through a loop of superconducting wire can persist indefinitely with no power source.

It was discovered that some cuprate-perovskite ceramic materials have a critical temperature above 90 K (−183° C.). Such a high transition temperature is theoretically impossible for a conventional superconductor, leading the materials to be termed high-temperature superconductors. Readily available coolant liquid nitrogen boils at 77 K, and thus the existence of superconductivity at higher temperatures than this facilitates many experiments and applications that are less practical at lower temperatures.

Densely-integrated cryogenic electronic systems employ electrical interconnect technology. In particular, superconducting cables with multiple signals, high signal density, low loss, low thermal leakage and small cross-sections are needed to operate as interconnects. The superconducting characteristics of thin-film niobium (Nb) make thin film Nb a viable material for realizing low-temperature (4 K or below) superconducting cables, such as high density DC cables and RF cables including microstrip and stripline. Thin-film flexible superconducting ribbon cables incorporating polymer dielectrics are particularly useful for making multiple interconnections between different substrates and/or different temperature zones.

SUMMARY

One example relates to a support structure for a superconducting system that can include a support member that is formed of thermally conductive material. The support member can include a plurality of parallel slots. Each slot extends from a first surface of a base of the support member to a second surface of the base, wherein the first and second surfaces of the base are positioned on parallel planes. Each slot can be shaped to allow relative movement of a fastener that allows a respective connector assembly to be affixed to the support member. The respective connector assembly can provide mechanical support for the flexible interconnect of the superconducting system and establish a heat path between the flexible interconnect and the support member. The support member can further include a wall extending transverse from the first surface of the base, the wall can include a plurality of through-holes.

Another example relates to a support structure for a superconducting system. The support structure can include a support member that is formed of thermally conductive material. The support member can include a plurality of parallel slots, wherein each slot extends from a first surface of a base of the support member to a second surface of the base, wherein the first and second surfaces are positioned on parallel planes. The support member can also include a wall extending transverse from the first surface of the base, the wall comprising a plurality of through-holes. The support member can further include a plurality of connector support rods. Each of the plurality of connector support rods can be affixed to the base of the support member via a respective slot. The support structure can still further include a plurality of connectors, wherein each connector is affixed to a respective connector support rod and each connector provides mechanical support for a flexible interconnect between at least two superconducting circuits mounted on respective blades of a superconducting system.

Yet another example relates to a system that can include a first superconducting system. The first superconducting system can include a plurality of blades and a plurality of superconducting circuits. Each superconducting circuit can be mounted on a respective blade of the first superconducting system, and each of the plurality of superconducting circuits in the first superconducting system includes low temperature superconducting materials. The system can also include a second superconducting system, the second superconducting system can include a plurality of blades and a plurality of superconducting circuits. Each superconducting circuit in the second superconducting system is mounted on a respective blade of the second superconducting system, and each of the plurality of superconducting circuits in the second superconducting system includes high temperature superconducting materials. The system further includes a support structure. The support structure includes a support member that can be formed of thermally conductive material. The support member includes a plurality of parallel slots, wherein each slot extends from a first surface of a base of the support member to a second surface of the base, wherein the first and second surfaces are positioned on parallel planes. The support member also includes a wall extending transverse from the first surface of the base. The wall can include a plurality of through-holes extending from a first surface of the wall to a second surface of the wall. The support member further includes a plurality of connector assemblies. Each connector assembly can include a connector support rod that is affixed to the base of the support structure via a respective slot and a connector affixed to the respective connector support rod and the connector provides mechanical support for a flexible interconnect between at least two superconducting circuits mounted on respective blades of the first superconducting system. The support structure can still further include an extender arm that can have a base that extends in a direction parallel to a surface of the wall of the support member. The extender arm can also have a column extending in a direction transverse to the base. A plurality of alignment connectors can be affixed to the column of the extender arm. Each alignment connector mechanically couples a given blade of the first superconducting system to a corresponding blade of the second superconducting system.

DETAILED DESCRIPTION

Figure 1:
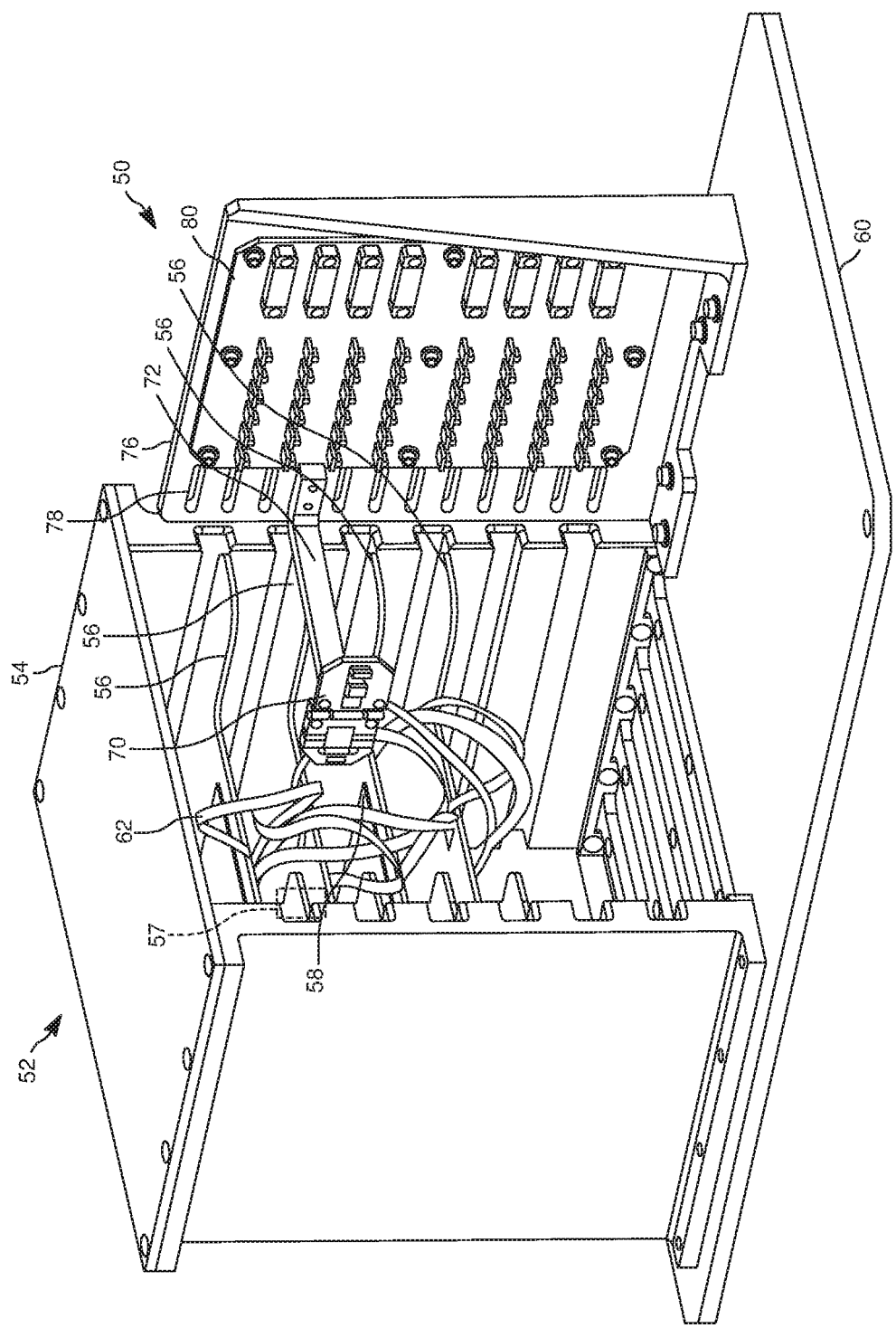
FIG. 1 illustrates an example of a support structure for a superconducting system.

The examples described herein are related to a system that includes a first superconducting system with a first plurality of blades housed in a chassis. Each of the first plurality of blades has a superconducting circuit mounted thereon and each of the plurality of superconducting circuits in the first superconducting system includes materials that superconduct at temperatures of 4 K (Kelvin) or less (e.g., low temperature superconducting materials). The system can also include a second superconducting system that has a second plurality of blades, and each of the second plurality of blades has a superconducting circuit mounted thereon, and each of the plurality of superconducting circuits in the second superconducting system includes materials that superconduct at temperatures of 77 K or less (e.g., high temperature superconducting materials).

The system also includes a support structure that can have a support member that can be formed of thermally conductive material. The support member can include a plurality of parallel slots, wherein each slot extends from a first surface of a base of the support member to a second surface of the base (e.g., through-holes). The support member can also include a wall extending transverse from the first surface of the base. The wall can include a plurality of through-holes that are employable to fasten the support member to a substrate.

The support member can further include a plurality of connector assemblies, wherein each connector assembly can have a connector support rod that is affixed to the base of the support via a respective slot on the support member. Each connector assembly can include a connector affixed to an end of a respective connector support rod, wherein the connector can provides mechanical support for a flexible interconnect between at least two superconducting circuits mounted on respective blades of the first superconducting system. Further, each connector assembly establishes a heat path between a flexible interconnect and the support member to dissipate heat when operating in a cryogenic environment.

Further, in some examples, the support structure can include an extender arm that is removably attached to the support member. The extender arm can include a base that extends in a direction parallel to a surface of the wall of the support member and a column extending a direction transverse to the base. The support structure can have a plurality of alignment connectors affixed to the column of the extender arm. Each alignment connector can mechanically couple a corresponding blade of the first superconducting system to a corresponding blade of the second superconducting system. In this manner, the support structure (including the extender arm) can be moved on one axis (e.g., a horizontal axis), and this movement causes corresponding movement in the first plurality of blades of the first superconducting system and the second plurality of blades in the second superconducting system that are affixed to the column via an alignment connector, which prevents breakage of interconnecting components.

FIG. 1 illustrates an example of a support structure 50 for a superconducting system 52. The superconducting system 52 can operate in a cryogenic environment, such as a region of the cryogenic environment with a temperature of about 4 Kelvin (K) or less. The superconducting system 52 can include a chassis 54 that houses M of blades 56, where M is an integer greater than or equal to two (2) that are slidable in grooves 57 of the chassis 54, wherein only two (2) of such grooves 57 are labeled. Each of the M number of blades 56 can operate as a heat spreader for a corresponding superconducting circuit 58 (some of which are hidden from view). In some examples, each superconducting circuit 58, or some subset thereof, can be implemented as a multi-chip module (MCM). The chassis 54 can be affixed to a thermally conductive substrate 60 (e.g., a plank of conductive material).

Each superconducting circuit 58 can include materials that superconduct at 4 K or less (e.g., low temperature superconducting materials). Each superconducting circuit 58 on a given blade 56 can communicate with another superconducting circuit 58 or multiple superconducting circuits 58 via a flexible interconnect 62. Stated differently, each flexible interconnect 62 provides a superconducting communication path between two superconducting circuits 58. Each flexible interconnect 62 can be formed of a superconducting polymide such as poly-oxydiphenylene-pyromellitimide.

To avoid inadvertent damage the flexible interconnects 62 should be handled with care at both room temperature (e.g., temperature greater than 273 K) and superconducting temperatures (e.g., 4 K and below). Additionally, as the superconducting system 52 transitions from room temperature (e.g., greater than 273 K) to superconducting temperatures (e.g., 4 K or below) different components of the superconducting system 52 have different coefficients of thermal expansion (CTEs). Thus, during transitions from room temperature to cryogenic temperature (e.g., 77 K and below), the flexible interconnects 62 are prone to breakage due to relative movement (e.g., due to different CTEs) between components to the superconducting system 52. Additionally, the problems of the different CTEs between components of the superconducting system 52 are amplified as the temperature decreases toward the cryogenic temperature.

Each flexible interconnect 62 (or some subset thereof) can be clamped by a connector 70 of the support structure 50. Each connector 70 aligns and connects traces on the corresponding flexible interconnect 62. The support structure 50 can include K number of connectors 70, where K is an integer greater than or equal to one (1). The connector 70 is affixed (e.g., mounted) on a connector support rod 72 of the support structure 50. The connector 70 and the connector support rod 72 can be formed of thermally conductive material, such as aluminum 6061. The connector support rod 72 can be affixed to a support member 76 (which may be referred to as a pegboard) of the support structure 50 via a slot 78 on the support member 76. A printed circuit board (PCB) 80 can be affixed on the support member 76. The support rod 70 and the support member 76 provide both thermal and structural support to each connector 70 and each flexible interconnect 62.

FIGS. 2-7 illustrate components and assemblies of the support structure 50 of FIG. 1. Moreover, FIGS. 2-7 employ the same reference numbers to denote the same structure. Additionally, for purposes of simplification of explanation, not all reference numbers are introduced or included in the description of each of the FIGS. 2-7.

Figure 2:
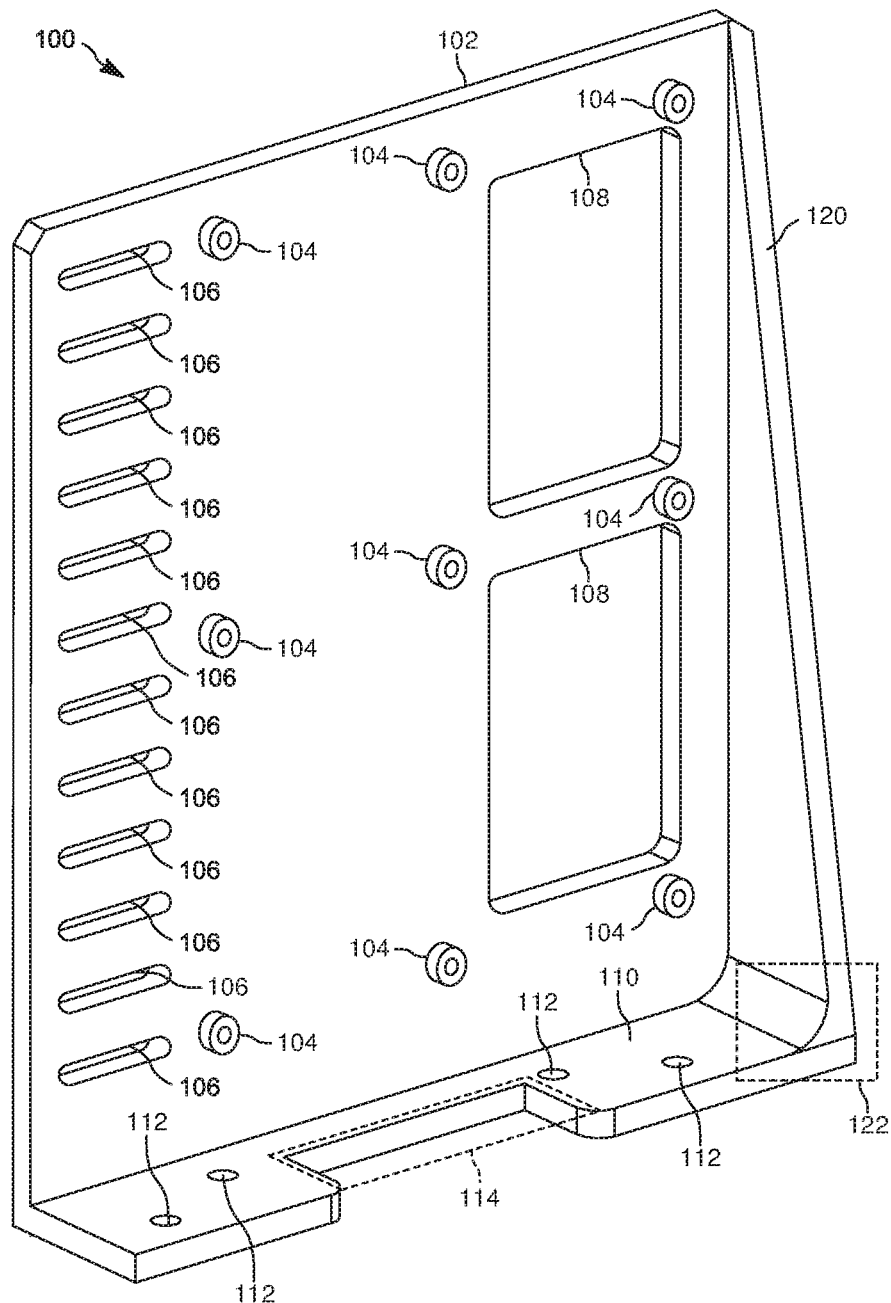
FIG. 2 illustrates an example of a support member for a support structure of a superconducting system.

FIG. 2 illustrates an example of a support member 100 of a support structure (e.g., the support structure 50 of FIG. 1) that is employable to implement the support member 76 of FIG. 1. The support member 100 can be referred to as a pegboard. The support member 100 can be formed of a conductive material, such as aluminum. More particularly, the support member 100 can be formed of aluminum 6061.

The support member 100 can include a base 102 (e.g., a plate) that extends in a first plane. The base 102 can have a rectangular prism like shape. The base 102 can include a plurality of bosses 104 (e.g., protuberances) that extend in a direction normal to the surface of the base 102 of the support member 100. Each boss 104 can have a round shape and a center hole. In some examples, the center hole can be threaded. The center hole of each boss 104 can receive a fastener (e.g., a screw, bolt or hold down) to enable a PCB (e.g., the PCB 80 of FIG. 1) to be affixed to the support member 100. That is, each boss 104 can be implemented as a receptacle for a fastener that is employable to secure the PCB to the support member 100. In the example illustrated, there are nine (9) bosses 104, but in other examples, there could be more or less bosses 104.

The base 102 can also include a plurality of slots 106. In the example illustrated, there are twelve (12) slots, but in other examples, there could be more or less slots 106. The plurality of slots 106 can be arranged in parallel. Moreover, each slot 106 is an elongated through-hole (e.g., having an elliptical base shape) that extends from a first surface of the base 102 to a second surface of the base 102. In fact, as used herein, the term "through-hole" denotes a hole that extends from a given surface of material to another surface of the material, wherein the other surface opposes the given surface.

As explained herein, the slots 106 are shaped receive fasteners that affix a connector support rod (e.g., the connector support rod 72 of FIG. 1) to the support member 100. Further, the slots 106 are elongated to allow relative movement of the connector support rod in one axis (e.g., a horizontal axis).

The base 102 can include a set of through-holes 108. Although there are two (2) through-holes 108, in other examples there can be more through-holes 108 or a single through-hole 108. The through-holes 108 can be implemented as square holes with rounded corners to allow connectors from the PCB to pass through.

The support member 100 can also include a first wall 110 that extends transversely (e.g., at a 90 degree angle) from the base 102. The first wall 110 includes through-holes 112 that can receive fasteners to allow the support member 100 to be affixed on a substrate (e.g., the thermally conductive substrate 60 of FIG. 1). In the example illustrated, there are four (4) through-holes 112, but in other examples there could be more or less such through-holes 112. Further, the first wall 110 can include a notch 114 (e.g., a recessed portion) for hardware.

The support member 100 can further include a second wall 120 that extends transversely from the base 102. Moreover, the second wall 120 can intersect the first wall 110 at a corner 122 of the support member 100. In some examples, the corner 122 has a draft angle (or curve). In some examples, the second wall 120 has a triangular prism shape.

Figure 3:
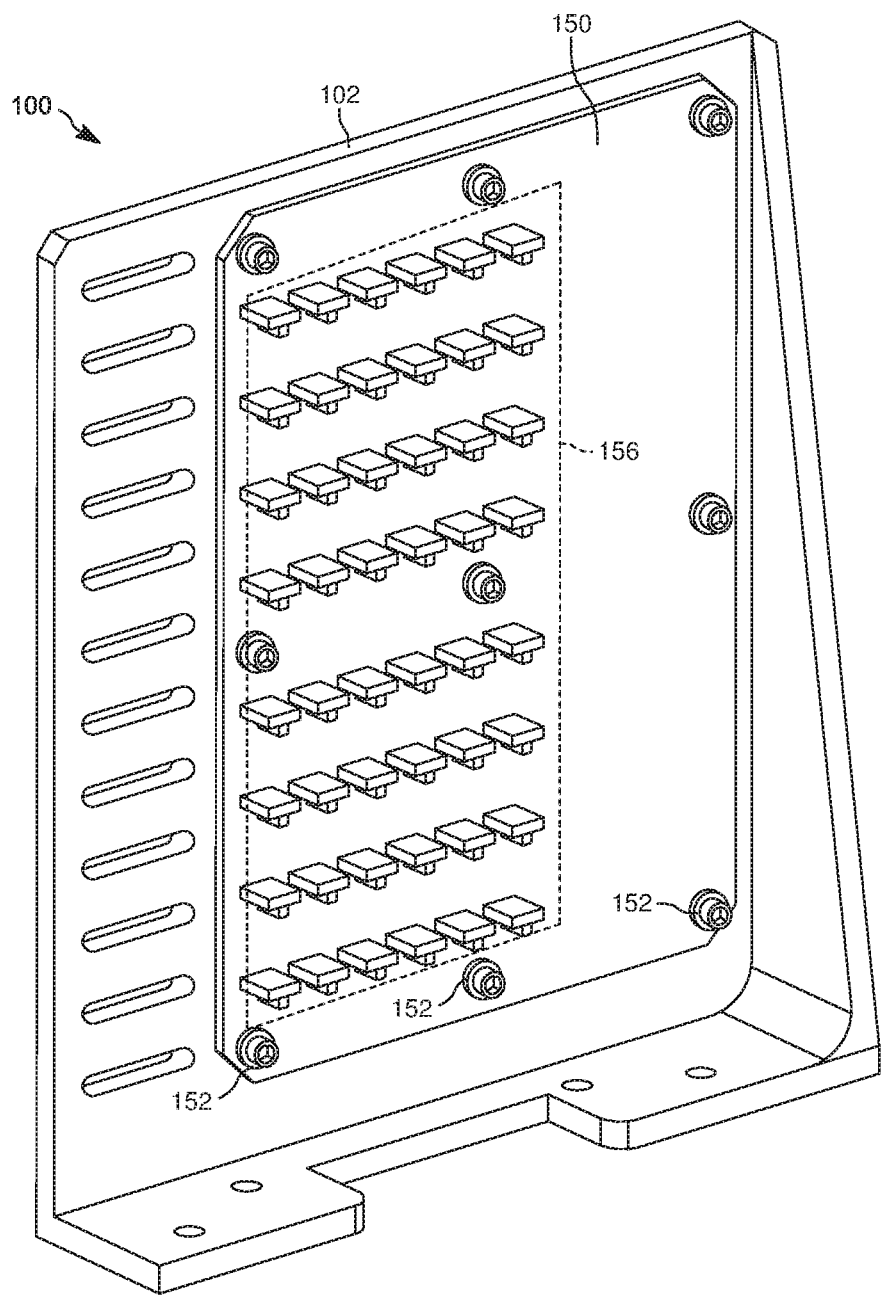
FIG. 3 illustrates am example of a support member for a support structure of a superconducting system with a printed circuit board (PCB) affixed to the support member.

FIG. 3 illustrates an example of the support member 100, wherein a PCB 150 is affixed to the base 102 of the support member 100 with fasteners 152 (only some of which are labeled). The fasteners 152 can be implemented as mechanical fasteners, such as bolts or screws. In the example illustrated, each fastener 152 is implemented as a hex head bolt. Additionally, each fastener 152 extends through a through-hole in the PCB 150 (hidden from view) and into a boss 104 (illustrated in FIG. 2) of the support member 100.

Figure 4:
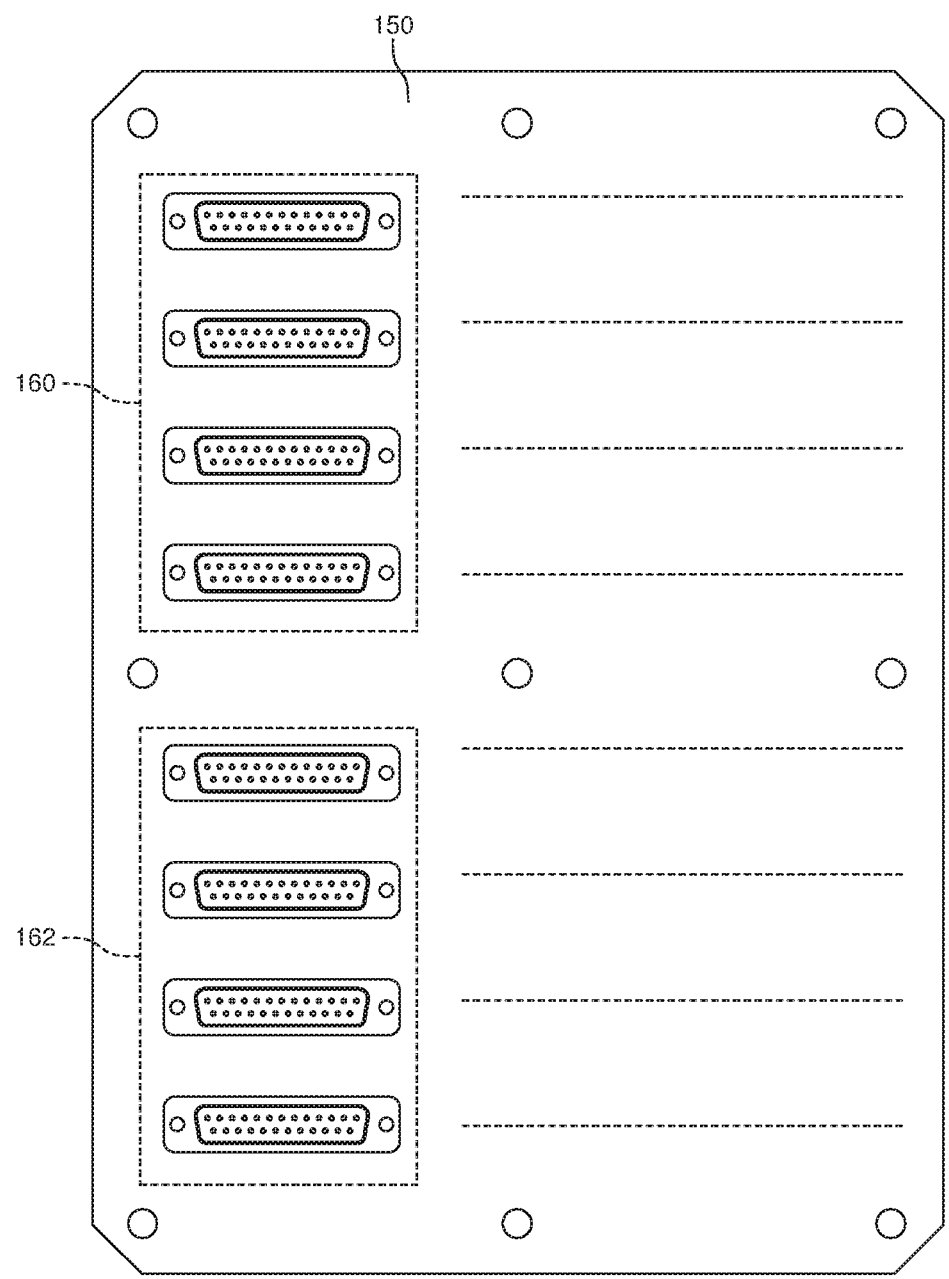
FIG. 4 illustrates an example of a PCB that can be affixed to a support member for a support structure of a superconducting system.

The PCB 150 can include a plurality of IC chips 156 mounted thereon. As some examples, the IC chips 156 can be implemented as temperature sensors, heaters or a combination thereof. Each of the IC chips 156, or some subset thereof can be coupled to a connector. FIG. 4 illustrates a view of the PCB 150 that is hidden from view in FIG. 3 (e.g. a backside). As illustrated in FIG. 4, the PCB 150 includes a first set of connectors 160 and a second set of connectors 162. Each connector in the first set of connectors 160 and the second set of connectors 162 can protrude through one of the holes 108 in the base 102 of the support structure illustrated in FIG. 1. The connectors can be coupled to an external system via a cable (not shown).

Figure 5:
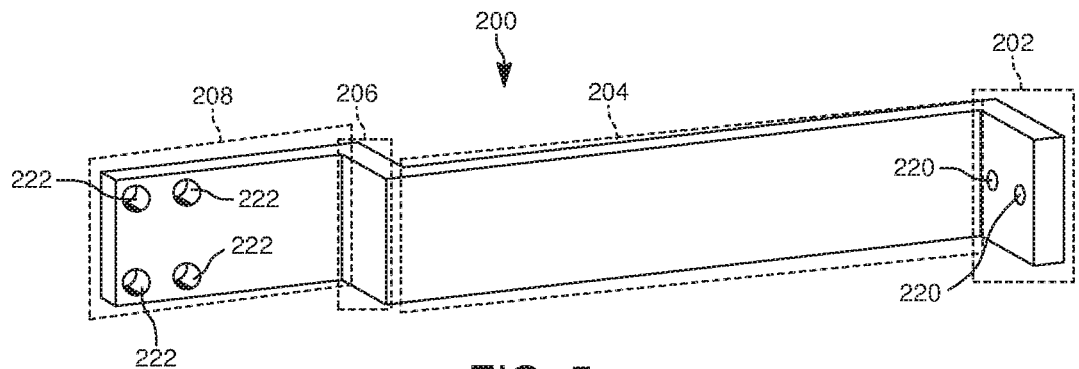
FIG. 5 illustrates an example of a connector support rod for a support structure of a superconducting system.

FIG. 5 illustrates an example of a connector support rod 200 for the support structure 50 of FIG. 1 that is employable to implement the connector support rod 72 of FIG. 1. The connector support rod 200, as illustrated, includes four portions, a first portion 202, a second portion 204, a third portion 206 and a fourth portion 208.

The first portion 202 includes a plurality of through-holes 220. In the example illustrated, there are two (2) through-holes 220 in the first portion 202 of the connector support rod 200. However, in other examples, there could be more or less through-holes 220. The through-holes 220 enable fasteners (e.g., bolts or screws) to pass therethrough. Moreover, the connector support rod 200 is configured such that the first portion 202 extends parallel to the plane on the surface of the base 102 illustrated in FIG. 2. In such a situation, the fasteners pass through the through-holes 220 and into one of the slots 106 of FIG. 1. Due to the size of the slots 106, the connector support rod 200 can move on one axis (e.g., the horizontal axis) relative to the support member 100 of FIG. 1 until the fasteners are tightened.

The second portion 204 extends in a direction transverse from the first portion 202. Moreover, the third portion 206 extends in a direction transverse from the second portion 204 and in a direction that opposes the first portion 202. The fourth portion 208 extends in a direction transverse from the third portion 206 and extends on a plane parallel to a plane of a surface of the second portion 204.

The fourth portion 208 includes a plurality of through-holes 222. In the example illustrated in FIG. 5, there are four (4) through-holes 222, but in other examples there could be more or less through-holes 222. The through-holes 222 enable a connector to be affixed to the fourth portion 208.

Figure 6:
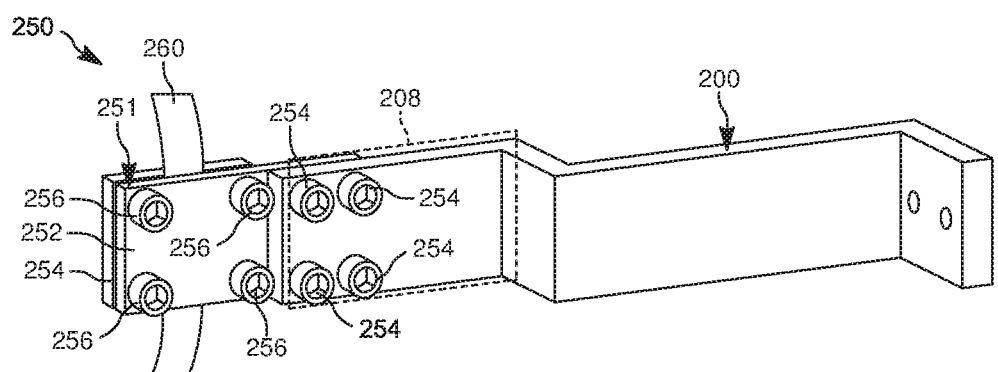
FIG. 6 illustrates an example of a connector assembly for a support structure of a superconducting system.

FIG. 6 illustrates an example of the connector assembly 250, wherein a connector 251 is affixed to the fourth portion 208 of the connector support rod 200 of FIG. 5. The connector 251 includes a first plate 252 and a second plate 254.

The first plate 252 includes a first set of through-holes (hidden from view) that receives fasteners 256 that pass through the plurality of holes (222 if FIG. 5) in the fourth portion 208 of the connector support rod 200. Additionally, the first plate 252 includes a second set of holes with fasteners 256 passing therethrough and into through-holes hidden from view in the second plate 254. In this manner, the second plate 254 of the connector 251 is affixed to the first plate 252 of the connector 251.

A flexible interconnect 260 can be sandwiched between the first plate 252 and the second plate 254. In this manner, the first plate 252 and the second plate 254 of the connector 251 clamps the flexible interconnect 260 to hold the flexible interconnect 260. The flexible interconnect 260 can be representative of an instance of the flexible interconnect 62 of FIG. 1.

Figure 7:
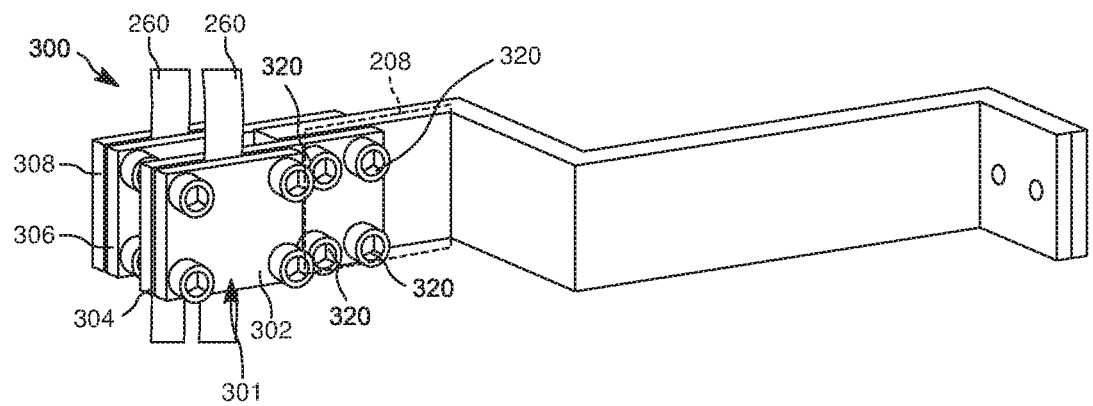
FIG. 7 illustrates another example of a connector assembly for a support structure of a superconducting system.

FIG. 7 illustrates an example of a connector assembly 300, wherein a connector 301 is affixed to the fourth portion 208 of the connector support rod 200 of FIG. 5. The connector 301 includes a first plate 302, a second plate 304, a third plate 306 and a fourth plate 308. The connector 301 can be implemented as two instances of the connector 251 of FIG. 6, wherein fasteners 320 affix the connector 301 to the connector support rod 200. Moreover, the connector 301 can clamp two (2) flexible interconnects 260 that can be held to a position parallel to each other.

Referring back to FIG. 1, in addition to mechanical support, by clamping each flexible interconnect 62 (or some subset thereof) to a respective connector 70, a heat path is established between the flexible interconnect 62 and the support member 76 of the support structure 50. More particularly, the flexible interconnect 62 is clamped by the connector 70, which is affixed to a connector support rod 72 and wherein the connector support rod 72 is affixed to the support member 76. Moreover, the flexible interconnect 62, the connector 70, the connector support rod 72 and the support member 76 of the support structure 50 are in thermal communication. Accordingly, because of the resultant heat path, heat built on the flexible interconnect 62 (due to communication between two superconducting circuits 62) can be dissipated at the support member 76.

Further, as noted, by clamping each flexible interconnect 62 (or some subset thereof), the clamped flexible interconnects 62 are held relatively still, and thereby relieving tension (e.g., due to gravity) that would otherwise be applied to the connected superconducting circuits 58, which could lead to component failure.

Figure 8:
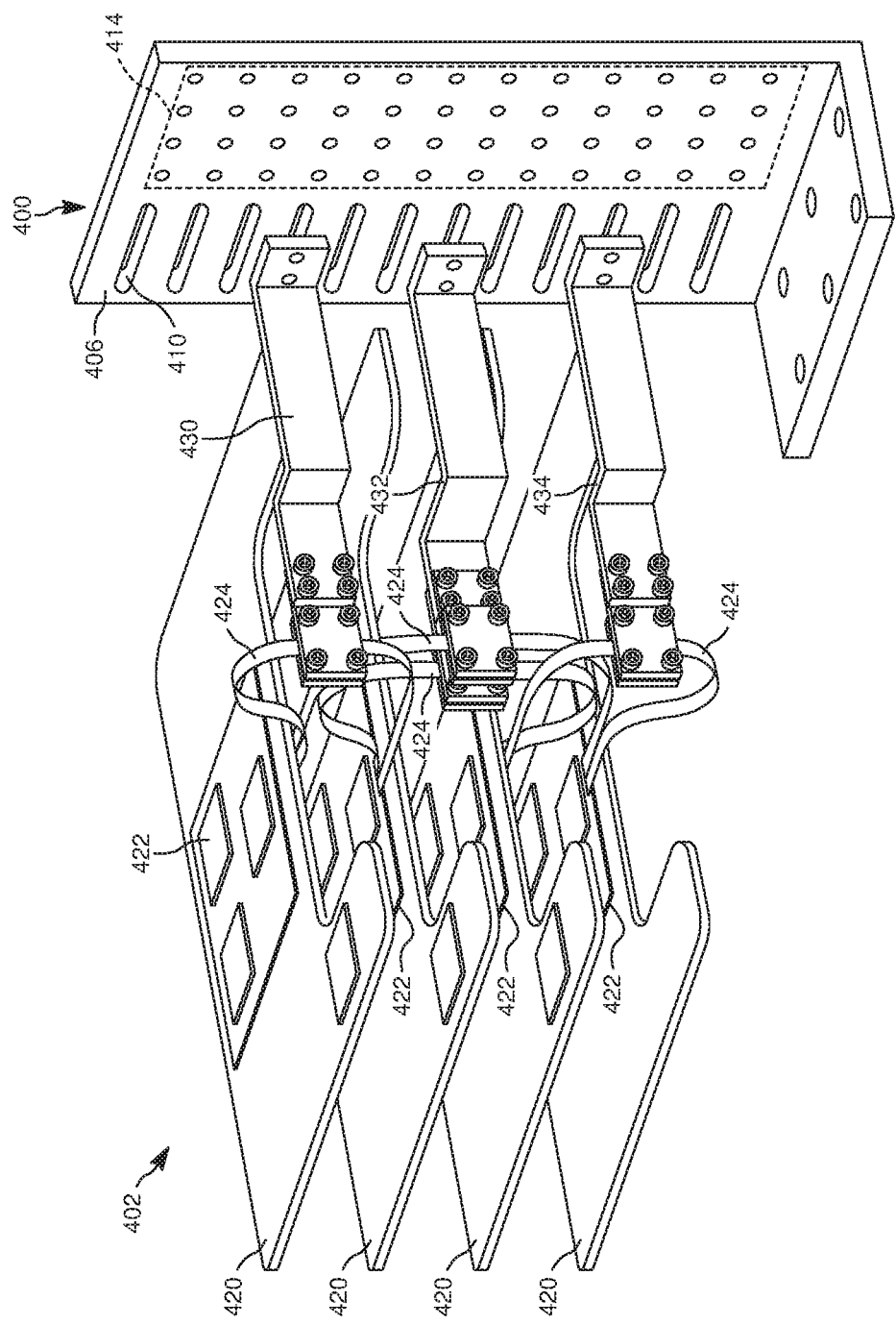
FIG. 8 illustrates an example of a support structure that includes connector assemblies that establish a heat path between flexible interconnects and a support member.

FIG. 8 illustrates another example of a support structure 400 for a superconducting system 402. The superconducting system 402 can be implemented in the same manner as the superconducting system 52 of FIG. 1, wherein the chassis is omitted for visual clarity.

The support structure 400 includes a support member 406. The support member 406 can be formed of thermally conductive material, such as aluminum (e.g., aluminum 6061). The support member 406 includes a plurality of slots 410 that are arranged in parallel, only one of which is labeled. The plurality of slots 410 can be implemented in a manner similar to the plurality of slots 78 illustrated in FIG. 1 and/or the slots 106 of FIG. 2. Additionally, the support member 406 includes a plurality of bobbin holes 414 (e.g., through-holes) that seat electrical components, such as heaters and/or temperature sensors (not shown).

The superconducting system 402 and the support structure 400 can operate in a cryogenic environment, such as a region of the cryogenic environment with a temperature of about 4 K or less. The superconducting system 402 can include a chassis (omitted for clarity) that houses M of blades 420. Each of the M number of blades 420 can operate as a heat spreader for a corresponding superconducting circuit 422. In some examples, each superconducting circuit 58, or some subset thereof, can be implemented as an MCM.

The superconducting circuits 422 can be connected through flexible interconnects 424, which can be implemented as the flexible interconnects 62 of FIG. 1. Each flexible interconnect 424 is clamped by a corresponding connector assembly. FIG. 8 illustrates three connector assemblies that are affixed to the support member 406 via a respective slot 410. More particularly, the support structure 400 includes a first connector assembly 430, a second connector assembly 432 and a third connector assembly 434. The first connector assembly 430 and the third connector assembly can be implemented as the connector assembly 250 of FIG. 6. The second connector assembly 432 can be implemented as the connector assembly 300 of FIG. 7.

As illustrated, the support structure 400 provides mechanical support for each of the flexible interconnects 424. Additionally, the first connector assembly 430, the second connector assembly 432 and the third connector assembly 434 provide a heat path from each corresponding flexible interconnect 424 to the support member 406.

Figure 9:
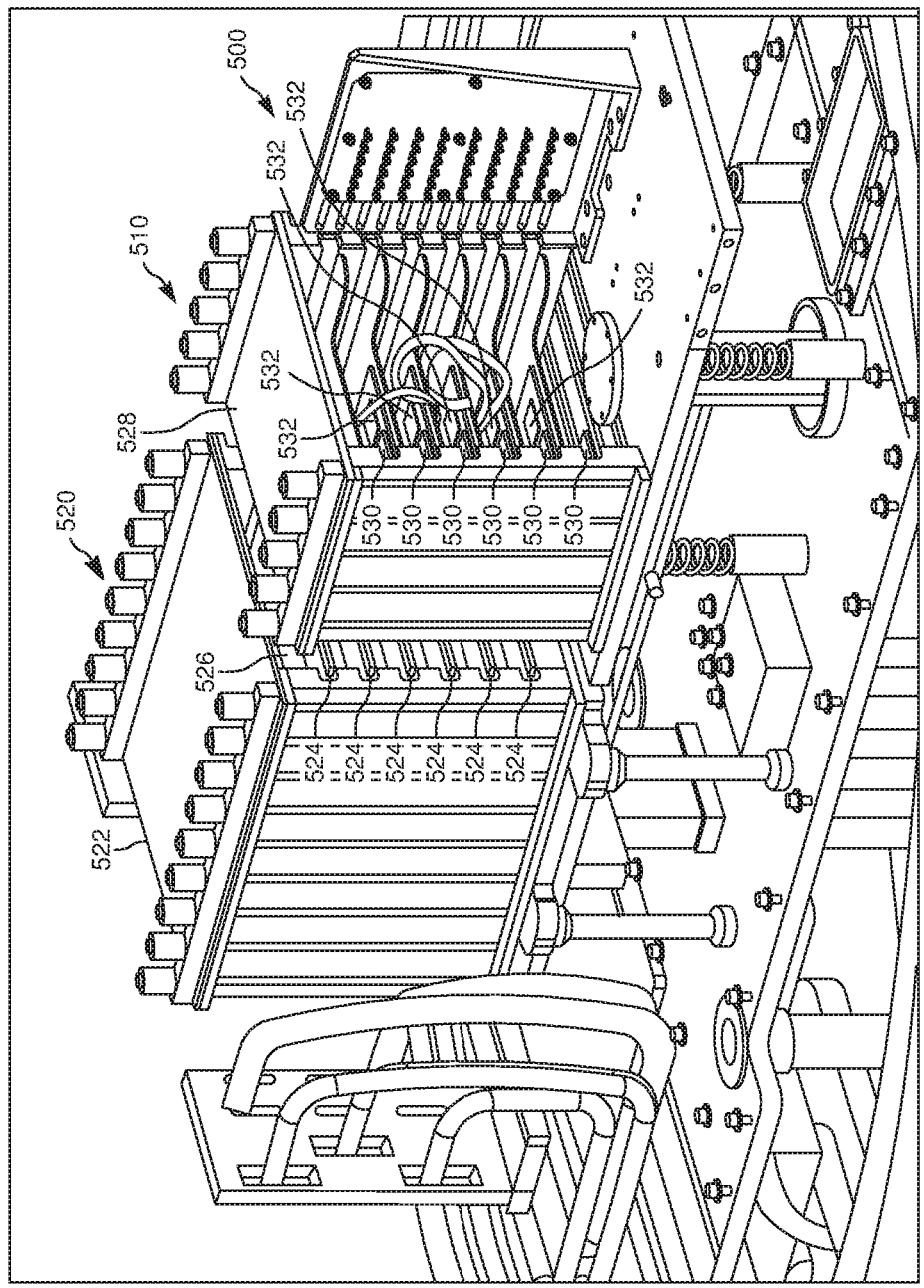
FIG. 9 illustrates a perspective view of an example of a support structure for a first superconducting system that communicates with a second superconducting system.

FIG. 9 illustrates a perspective view of an example of a support structure 500 for a first superconducting system 510 that is communicatively coupled to a second superconductive system 520. The first superconducting system 510 can operate in a first cryogenic zone that is about 4 K or less and the second superconducting system 520 can operate in a second cryogenic zone that is about 77 K to about 75 k. That is, the first superconducting system 510 operates at a lower temperature than the second superconducting system 520.

The first superconducting system 510 can be similar to the superconducting system 52 of FIG. 1 and/or the superconducting system 402 of FIG. 8. The second superconducting system 520 can include a chassis 522 with J number of blades 524 installed therein, where J is an integer greater than or equal to one. Each blade 524 can operate as a heat spreader for a superconducting circuit 526 (only one of which is labeled). Each superconducting circuit 526 can include an MCM implemented with high temperature superconducting (HTS) materials. Similarly, the first superconducting system 510 can include a chassis 528 that houses a plurality of blades 530 that each include a superconducting circuit 532 (e.g., an MCM), as described with respect to FIG. 1.

Figure 10:
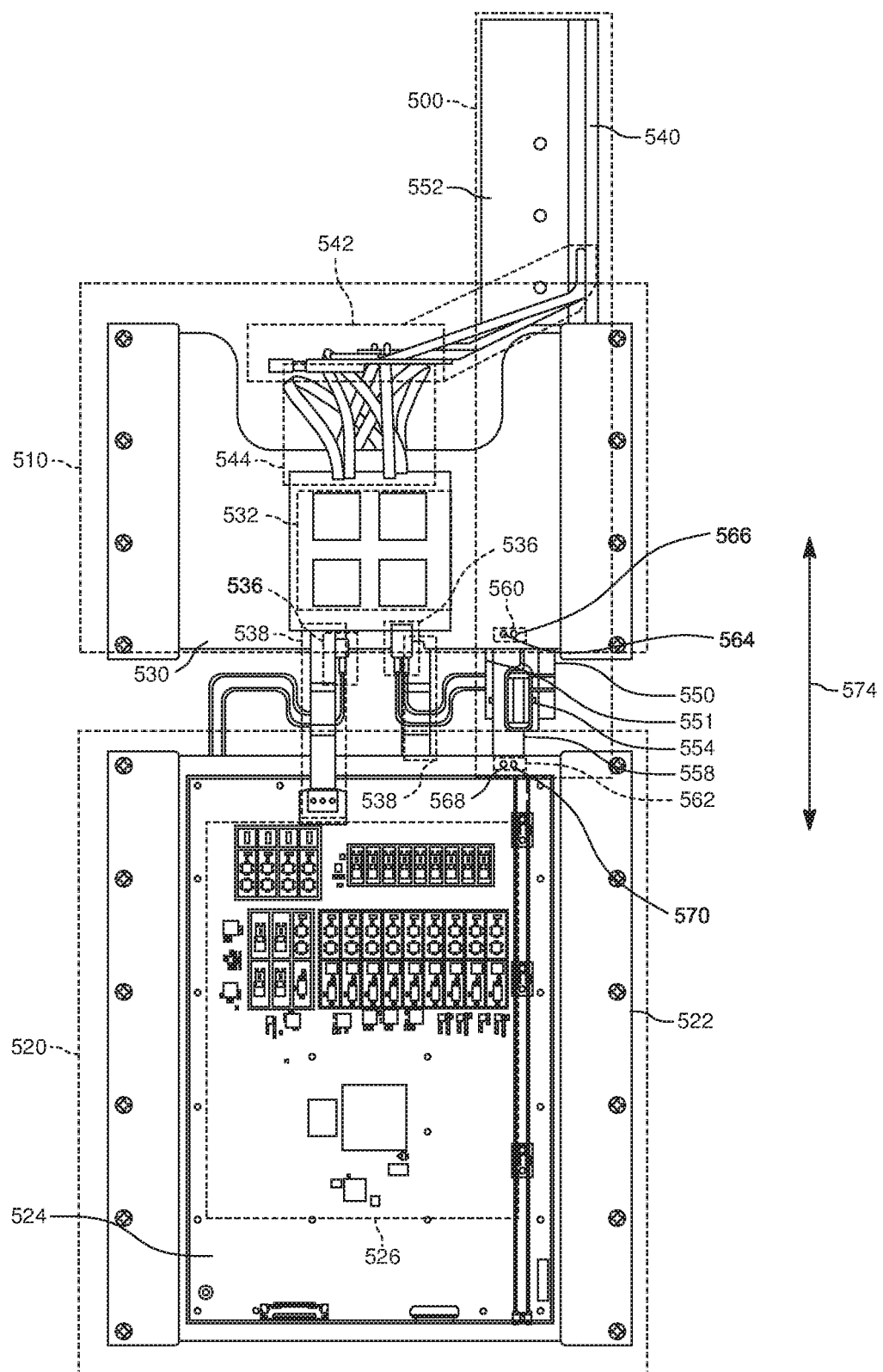
FIG. 10 illustrates an overhead view of a support structure for a first superconducting system that communicates with a second superconducting system.
Figure 11:
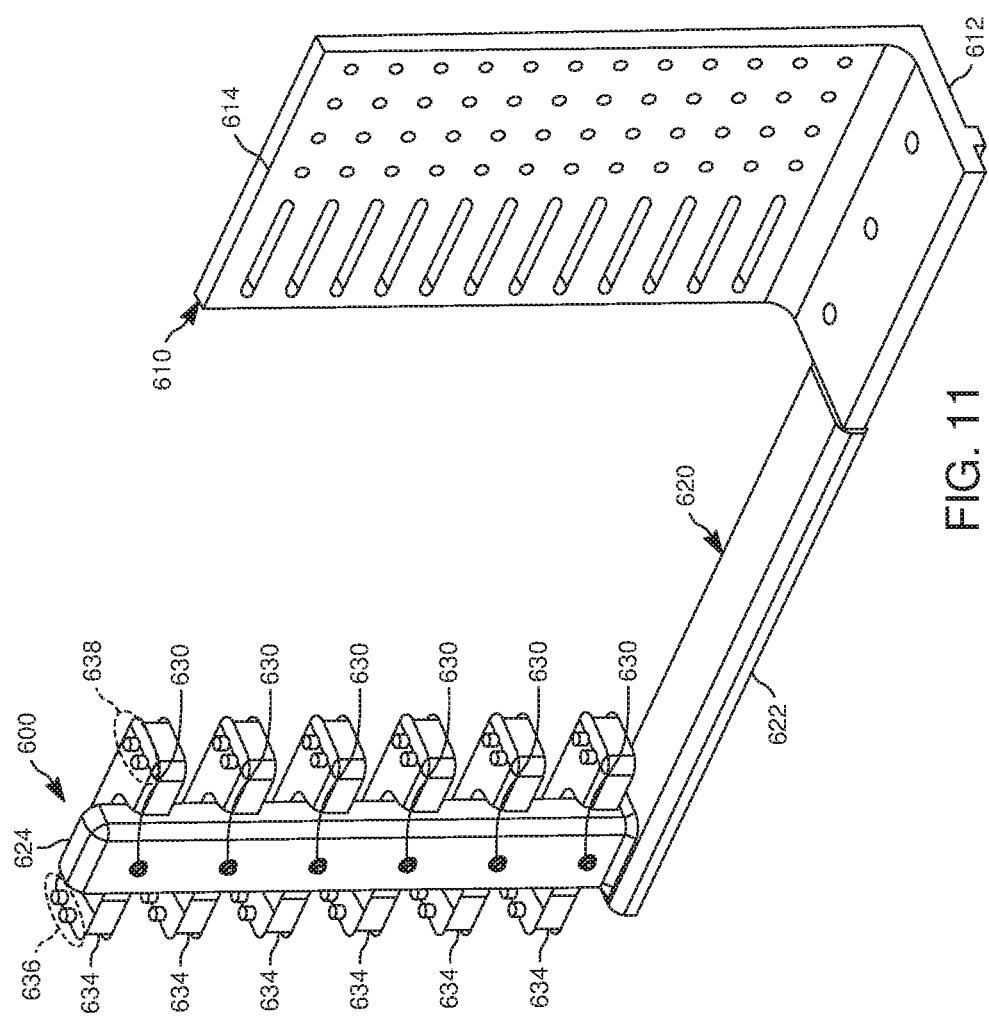
FIG. 11 illustrates an example of a support structure with an extender arm.

Further, FIG. 10 illustrates an overhead view of the support structure 500 for the first superconducting system 510 that is communicatively coupled to the second superconductive system 520. FIGS. 10 and 11 employ the same reference numbers to denote the same structure. Additionally, in FIG. 10, a top portion of the chassis 528 of the first superconducting system 510 and the chassis 522 of the second superconducting system 510 has been removed for visual clarity.

The first superconducting system 510 and the second superconducting system 520 communicate can via communication channels 536 and 538. In some examples, the communication channels 536 and 538 can be formed of wires and/or flexible interconnects (e.g., superconducting flexible interconnects).

The support structure 500 can include features of the support structure 50 of FIG. 1 and/or the support structure 400 of FIG. 8. Thus, the support structure 500 includes a support member 540. The support member 540 can be implemented with the support member 100 of FIG. 2 and/or the support member 406 of FIG. 8. Additionally, connector assemblies 542 clamp and hold flexible interconnects 544 of the first superconducting system 510 in a manner described herein (e.g., as shown in FIGS. 1 and 9).

Further, the support structure 500 can include an extender arm 550 that is removably connected to the support structure 500. The extender arm 550 includes a base 551 that extends in a direction parallel to a surface of a wall 552 of the support member 540. The extender arm 550 can include a column 554 that extends transversely from base 551 of the extender arm 550. A plurality of alignment connectors 558 can be affixed to the column 554 (only one of which is visible in FIG. 10). Each alignment connector 558 can include a first pin pair 560 and a second pin pair 562. The first pin pair 560 are implemented as pins that protrude into a through-hole 564 and a through slot 566 (e.g., a through-hole with an elliptical base shape) included on a blade 530 of the first superconducting system 510. Similarly, the second pin pair 562 are implemented as pins that protrude into a through-hole 568 and a through slot 570 (e.g., a through-hole with an elliptical base shape) included on a blade 524 of the second superconducting system 520. Thus, each of the blades 530 (or some subset thereof) on the first superconducting system 510 are rigidly connected to a corresponding blade 524 on the second superconducting system 510. Additionally, each of the blades 530 (or some subset thereof) on the first superconducting system 510 and each blade 524 of the second superconducting system 520 are rigidly connected to the column 554 of the support structure 500. In this manner, during installation at room temperature (e.g., temperatures greater than 273 K), the support structure 500 can be moved in a direction indicated by the arrow 574 (e.g., in the horizontal direction).

FIG. 11 illustrates an example of a support structure 600 that is employable to implement the support structure 500 of FIG. 10. Moreover, for purposes of clarity, the first superconducting system 510 and the second superconducting system 520 are not shown.

The support structure 600 includes a support member 610. The support member 610 illustrated in FIG. 11 is implemented with the support member 406 of FIG. 8. However, in other examples, another support member, such as the support member 100 of FIG. 2 is also employable as the support member 610. The support member 610 includes a wall 612 that extends in a transverse direction from a base 614 of the support member 610.

The wall 612 of the support member 610 includes a surface that extends on a first plane. Moreover, an extender arm 620 includes a base 622 that extends in the first plane, the same plane as the surface of the wall 612. Additionally, a column 624 extends in a transverse direction from the first plane, and parallel to a surface of the base 614 of the support member 610. The column 624 can be employed to implement the column 554 of FIG. 11.

The column 624 can include J number of through-holes 630, where J is an integer greater than or equal to one. Each of the J number of through-holes 630 is shaped to receive a fastener (e.g., a bolt or screw) to affix an alignment connector 634 to the column 624. Although FIG. 11 illustrates J number of alignment connectors 634, in some examples, there could be fewer alignment connectors 634. Each alignment connector 634 can include a first pair of pins 636 and a second set of pins 638, wherein FIG. 11 only labels the pin pairs on one of the alignment connectors 634. The first pair of pins 636 and the second set of pins 638 are employable to mechanically couple a blade of a first superconducting system and a blade of a second superconducting system, as illustrated in detail in FIG. 10.

Referring back to FIG. 10 moving the support structure in the direction 574 causes each of the blades 530 (or some subset thereof) of the first superconducting system 510 and each blade 524 (or some subset thereof) of the second superconducting system 520 to move in concert. Accordingly, the communication channels 536 and 538 between the first superconducting system 510 and the second superconducting system 520 are not moved relative to each other. That is, the communication channels 536 and 538 each move along with the corresponding blade 530 of the first superconducting system 510 and the corresponding blade 524 of the second superconducting system. Furthermore, moving in the direction 574 also causes the flexible interconnects 544 of the first superconducting system 510 to move in concert with each respective blade 530. Thus, moving the support structure 500 (at room temperature) allows the blades 530 to be accessed while preventing relative movement between such blades 530 that might otherwise damage the flexible interconnects 544.

After installation, the extender arm 550 including the column 554 can be removed to prevent undesired thermal transfer between the first superconducting system 510 and the second superconducting system 520. Thus, the extender arm 550 facilitates access to certain components of the first superconducting system 510 and the second superconducting system 520 without disturbing delicate components of the first superconducting system 510 and the second superconducting system 520.

What have been described above are examples. It is, of course, not possible to describe every conceivable combination of components or methodologies, but one of ordinary skill in the art will recognize that many further combinations and permutations are possible. Accordingly, the disclosure is intended to embrace all such alterations, modifications, and variations that fall within the scope of this application, including the appended claims. As used herein, the term "includes" means includes but not limited to, the term "including" means including but not limited to. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A support structure for a flexible interconnect of a superconducting system comprising:
 a support member that is formed of thermally conductive material, the support member comprising:
  a plurality of parallel slots, wherein each slot extends from a first surface of a base of the support member to a second surface of the base, wherein the first and second surfaces of the base are positioned on parallel planes, wherein each slot is shaped to allow relative movement of a fastener that allows a respective connector assembly to be affixed to the support member, and the respective connector assembly provides mechanical support for the flexible interconnect of the superconducting system and establishes a heat path between the flexible interconnect and the support member; and a wall extending transverse from the first surface of the base, the wall comprising a plurality of through-holes.

2. The support structure of claim 1, wherein the wall is a first wall, the support member further comprising:
   a plurality of bosses, wherein each boss extends normal to the first surface of the support member; and
   a second wall extending transverse from the base, wherein the first wall and the second wall meet at a corner of the support member.

3. The support structure of claim 2, wherein the first wall comprises a notch positioned between two of the plurality of through-holes.

4. The support structure of claim 1, wherein the support member further comprises a through-hole, wherein the through-hole is spaced apart from each of the plurality of parallel slots, and the through-hole has a square shape with rounded corners.

5. The support structure of claim 1, wherein each connector assembly comprises a connector support rod that is formed of thermally conductive material, wherein the connector support rod comprises:
   a first portion extending in along the first surface of the base of the support member, wherein the first portion comprises a plurality of through-holes shaped to receive fasteners that fasten the connector support rod to a respective slot of the plurality of parallel slots of the support member, wherein the connector support rod is in thermal communication with the support member;
   a second portion extending transverse to the first portion of the connector support rod;
   a third portion extending parallel to the second portion of the connector support rod, wherein the third portion comprises a plurality of through-holes for affixing a connector that is formed of thermally conductive material to the connector support rod, wherein the connector is in thermal communication with the support member.

6. The support structure of claim 5, wherein the connector comprises:
   a first plate comprising:
      a first plurality of through-holes for fasteners to affix the first plate to the third portion of the connector support rod;
      a second plurality of through-holes; and
   a second plate comprising a plurality of through-holes for fasteners to affix the second plate to the first plate of the connector.

7. The support structure of claim 6, wherein the flexible interconnect of the superconducting system is clamped between the first plate and the second plate of the connector, wherein the flexible interconnect is coupled to a first multi-chip module (MCM) and a second MCM of the superconducting system, wherein the flexible interconnect in in thermal communication with the support member.

8. The support structure of claim 7, wherein the flexible interconnect is formed of a superconducting material operating in a cryogenic environment, and the flexible interconnect is operating at a higher temperature than the connector, such that heat from the flexible interconnect dissipates to the support member via the heat path.

9. The support structure of claim 5, wherein the connector comprises:
   a first plate comprising a first plurality of through-holes and a second plurality of through-holes for fasteners to affix the first plate to the third portion of the connector support rod; and
   a second plate comprising a first plurality of through-holes for fasteners that fasten the second plate to the first plate of the connector;
   a third plate comprising a first plurality of through-holes and a second plurality of through-holes for fasteners to affix the third plate to the third portion of the connector support rod; and
   a fourth plate comprising a plurality of through-holes for fasteners that fasten the fourth plate to the third plate of the connector.

10. The support structure of claim 9, wherein the flexible interconnect of the superconducting system comprises:
    a first flexible interconnect that is clamped between the first plate and the second plate of the connector; and
    a second flexible interconnect that is clamped between the third plate and the fourth plate of the connector, wherein the first flexible interconnect is coupled to a first multi-chip module (MCM) and a second MCM and the second flexible interconnect is coupled to the first MCM and a third MCM.

11. The support structure of claim 10, further comprising an extender arm, the extender arm comprising:
    a base extending in a direction parallel to the wall of the support member; and
    a column extending transverse to the base of the extender arm and parallel to the base of the support member.

12. The support structure of claim 11, wherein the column of the extender arm comprises a plurality of through-holes, the support structure further comprising:
    a plurality of parallel alignment connectors affixed to the column, wherein each of the parallel alignment connectors comprises a plurality of pins to connect to a pair of blades that each provide a heat spreader for superconducting MCMs.

13. The support structure of claim 12, wherein a first blade of a given pair of blades coupled to a given alignment connector is configured to operate at a first cryogenic temperature and a second blade of the given pair of blades is configured to operate at a second cryogenic temperature, and the second cryogenic temperature is higher than the first cryogenic temperature.

14. The support structure of claim 1, wherein the support member further comprises a plurality of bobbin holes, wherein each of the bobbin holes comprises a through-hole.

15. The support structure of claim 1, further comprising a printed circuit board mounted to the base of the support member.

16. The support structure of claim 1, wherein the printed circuit board comprises at least one of a heater and a temperature sensor.

17. A support structure for a superconductor circuit comprising:
    a support member that is formed of thermally conductive material, the support member comprising:
       a plurality of parallel slots, wherein each slot extends from a first surface of a base of the support member to a second surface of the base, wherein the first and second surfaces are positioned on parallel planes; and
       a wall extending transverse from the first surface of the base, the wall comprising a plurality of through-holes;
    a plurality of connector support rods, wherein each of the plurality of connector support rods is affixed to the base of the support member via a respective slot; and
    a plurality of connectors, wherein each connector is affixed to a respective connector support rod and each connector provides mechanical support for a flexible interconnect between at least two superconducting circuits mounted on respective blades of a superconducting system.

18. The support structure of claim 17, wherein the superconducting system is a first superconducting system, the system further comprising:
an extender arm comprising:
a base that extends in a direction parallel to a surface of the wall of the support member; and
a column that extends in a direction transverse to the base of the extender arm;
a plurality of alignment connectors affixed to the column of the extender arm, wherein each of the plurality of alignment connectors includes a first set of pins for connecting to a blade of a first superconducting system and a second set of pins for connecting to a blade of a second superconducting system.

19. The support structure of claim 18, wherein movement of the extender arm causes movement of the blade of the first superconducting system and the blade of the second superconducting system.

20. A system comprising:
a first superconducting system, the first superconducting system comprising:
a plurality of blades; and
a plurality of superconducting circuits, wherein each superconducting circuit is mounted on a respective blade of the first superconducting system, and each of the plurality of superconducting circuits in the first superconducting system includes low temperature superconducting materials;
a second superconducting system, the second superconducting system comprising:
a plurality of blades; and
a plurality of superconducting circuits, wherein each superconducting circuit in the second superconducting system is mounted on a respective blade of the second superconducting system, and each of the plurality of superconducting circuits in the second superconducting system includes high temperature superconducting materials;
a support structure comprising:
a support member that is formed of thermally conductive material, the support member comprising:
a plurality of parallel slots, wherein each slot extends from a first surface of a base of the support member to a second surface of the base, wherein the first and second surfaces are positioned on parallel planes; and
a wall extending transverse from the first surface of the base, the wall comprising a plurality of through-holes extending from a first surface of the wall to a second surface of the wall;
a plurality of connector assemblies, wherein each connector assembly comprises:
a connector support rod that is affixed to the base of the support structure via a respective slot; and
a connector affixed to the respective connector support rod and the connector provides mechanical support for a flexible interconnect between at least two superconducting circuits mounted on respective blades of the first superconducting system; and
an extender arm comprising:
a base that extends in a direction parallel to a surface of the wall of the support member; and
a column extending in a direction transverse to the base; and
a plurality of alignment connectors affixed to the column of the extender arm, wherein each alignment connector mechanically couples a given blade of the first superconducting system to a corresponding blade of the second superconducting system.

\* \* \* \* \*